United States Patent
Poyil et al.

(10) Patent No.: US 10,985,695 B2
(45) Date of Patent: Apr. 20, 2021

(54) DC ARC DETECTION AND PHOTOVOLTAIC PLANT PROFILING SYSTEM

(71) Applicant: Analog Devices International Unlimited Company, Hamilton (BM)

(72) Inventors: Bijesh Poyil, Bangalore (IN); Hans Brueggemann, Kelkheim (DE); Daniel Brian O'Malley, Cappamore (IE)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 244 days.

(21) Appl. No.: 16/114,571

(22) Filed: Aug. 28, 2018

(65) Prior Publication Data
US 2020/0076364 A1    Mar. 5, 2020

(51) Int. Cl.
*H02S 50/10*    (2014.01)
*G01R 31/12*    (2020.01)

(52) U.S. Cl.
CPC .......... *H02S 50/10* (2014.12); *G01R 31/1227* (2013.01)

(58) Field of Classification Search
CPC ............................ H02S 50/10; G01R 31/1227
USPC ........................................................ 702/58
See application file for complete search history.

(56) References Cited

U.S. PATENT DOCUMENTS

| | | | |
|---|---|---|---|
| 4,639,817 A * | 1/1987 | Cooper | H02H 1/0015 361/113 |
| 6,633,824 B2 | 10/2003 | Dollar, II | |
| 7,391,218 B2 * | 6/2008 | Kojori | H02H 1/0015 324/520 |
| 8,179,147 B2 | 5/2012 | Dargatz et al. | |
| 8,218,274 B2 | 7/2012 | Hastings et al. | |
| 8,576,520 B2 | 11/2013 | Pamer et al. | |
| 8,878,563 B2 | 11/2014 | Robbins | |
| 9,008,978 B2 | 4/2015 | Robbins | |
| 9,043,039 B2 | 5/2015 | Eizips et al. | |
| 9,046,588 B2 | 6/2015 | Behrends et al. | |
| 9,502,885 B2 | 11/2016 | Martin et al. | |
| 9,837,809 B2 | 12/2017 | Chae et al. | |

(Continued)

OTHER PUBLICATIONS

Howard Austerlitz, In Data Acquisition Techniques Using PCs (Second Edition), 2003, Chapter 4 (Year: 2003).*

(Continued)

*Primary Examiner* — Catherine T. Rastovski
*Assistant Examiner* — Aeysha N Sultana
(74) *Attorney, Agent, or Firm* — Patent Capital Group

(57) ABSTRACT

An arc detection method includes classifying whether an arc fault is present in the power system by, for each of a plurality of bins of a current frame of a signal, marking the bin as a candidate bin if a magnitude spectrum of the bin meets first criteria; determining a number of candidate bins in the current frame; marking the number of candidate bins as candidate cluster bins if the number of candidate bins exceeds a minimum cluster size; for each of the candidate cluster bins, determining whether the candidate cluster bin is also a candidate cluster bin of a previous frame of the first signal and if so, identifying the current frame as a candidate frame and incrementing a candidate frame count; and if the candidate frame count exceeds a candidate frame count threshold, determining that an arc fault is present in the power system.

20 Claims, 14 Drawing Sheets

(56) References Cited

U.S. PATENT DOCUMENTS

| | | | |
|---|---|---|---|
| 2010/0165521 A1* | 7/2010 | Changali | H02H 1/0015 361/42 |
| 2012/0116696 A1* | 5/2012 | Wank | G01R 31/42 702/58 |
| 2012/0206843 A1 | 8/2012 | Dargatz et al. | |
| 2012/0316804 A1 | 12/2012 | Oberhauser | |
| 2012/0318320 A1* | 12/2012 | Robbins | H02H 1/0015 136/244 |
| 2014/0063662 A1 | 3/2014 | Scott | |
| 2014/0373894 A1 | 12/2014 | Stratakos et al. | |
| 2016/0003886 A1 | 1/2016 | Djeddi | |
| 2017/0026996 A1 | 1/2017 | Cheung et al. | |
| 2017/0082672 A1 | 3/2017 | Schneider et al. | |
| 2017/0146589 A1 | 5/2017 | Li et al. | |
| 2017/0170782 A1* | 6/2017 | Yoscovich | H02H 1/0015 |
| 2017/0179880 A1 | 6/2017 | Merz | |
| 2017/0207746 A1 | 7/2017 | Yoscovich et al. | |
| 2017/0254847 A1 | 9/2017 | Biber et al. | |
| 2017/0324236 A1 | 11/2017 | Tomita et al. | |
| 2017/0343596 A1 | 11/2017 | Misumi | |

OTHER PUBLICATIONS

Howard Austerlitz, In Data Acquisition Techniques Using PCs (Second Edition), 2003, Chapter 4, p. 74, Figure 4-14a and Paragraph—Aliasing (Year: 2003).*

Srinivas, et al, Apr. 2017—Modulated Multi-Level Fundamental Frequency Inverter for Three-Phase Photovoltaic Application, p. 24-28 (Year: 2017).*

* cited by examiner

DC ARC DETECTION AND PHOTOVOLTAIC PLANT PROFILING SYSTEM

FIELD OF THE DISCLOSURE

This disclosure relates generally to the field of photovoltaic ("PV") power generation systems and, more particularly, to techniques for DC arc detection and plant profiling for PV inverters.

BACKGROUND

Power systems are ubiquitous. Examples of power systems include industrial power plants, solar farms, wind farms, residential solar power systems, and electric automobiles. Typically, power systems supply, transmit, and consume electric power. Power is usually delivered over cables; in some situations, cables may be disconnected, leaving a small air gap between conductors. Depending on the environment surrounding the air gap, an electric arc may form between the two conductors, which may be dangerous if the faulty part of the power system is not shut down in time. Especially when high voltage power is involved, the risk of electric shock or fire is high. For this reason, many power systems are equipped with arc detectors for detecting arc faults, which may be used to trigger arc fault circuit interrupters that may mechanically disconnect the power source. It is not surprising that the solar industry, for example, has developed a PV arc-fault circuit protection standard.

SUMMARY OF THE DISCLOSURE

An arc detection method that is tolerant to noise of an inverter of a power system is disclosed and includes sampling, by an analog-to-digital converter, a first signal on a first power line to generate a plurality of first digital samples at a first sampling frequency; filtering, using a comb filter, the plurality of digital samples to remove a switching noise frequency of the inverter from the first digital samples; transforming, using a Fast Fourier Transform ("FFT") module, for example, a first window of the first digital samples to a first frequency-domain representation; and classifying, by an arc detector, whether an arc fault is present in the power system. The classifying further includes, for each of a plurality of bins comprising a current frame of the first signal, marking the bin as a candidate bin if a magnitude spectrum of the bin falls within a first frequency range and exceeds a reference magnitude spectrum; determining a number of candidate bins in the current frame, wherein the number of candidate bins in the frame comprises a cluster size; marking the number of candidate bins as candidate cluster bins if the cluster size exceeds a minimum cluster size; for each of the candidate cluster bins, determining whether the candidate cluster bin is also a candidate cluster bin of a previous frame of the first signal and if so, identifying the current frame as a candidate frame and incrementing a candidate frame count; and if the candidate frame count exceeds a candidate frame count threshold, determining that an arc fault is present in the power system.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION OF EXAMPLE EMBODIMENTS

Photovoltaic ("PV") power generation systems have been in worldwide use for both commercial and residential applications since around 1980. PV power generation systems are clean, environmentally friendly, and sustainable sources of energy. One factor that limited the widespread adoption of PV power generation systems was the cost of such system, which has been significantly reduced in recent years. The cumulative installed solar PV power capacity increased 29% year-on-year to 229 GW by the end of 2015. It is projected that 700 GW of global installed power is possible by 2020. The rapid expansion of PV power generation system installations results in a cleaner energy supply, but also brings with it potential hazards. For example, in the United States alone there have been a number of high profile fires caused by arcing in PV systems.

Figure 1:
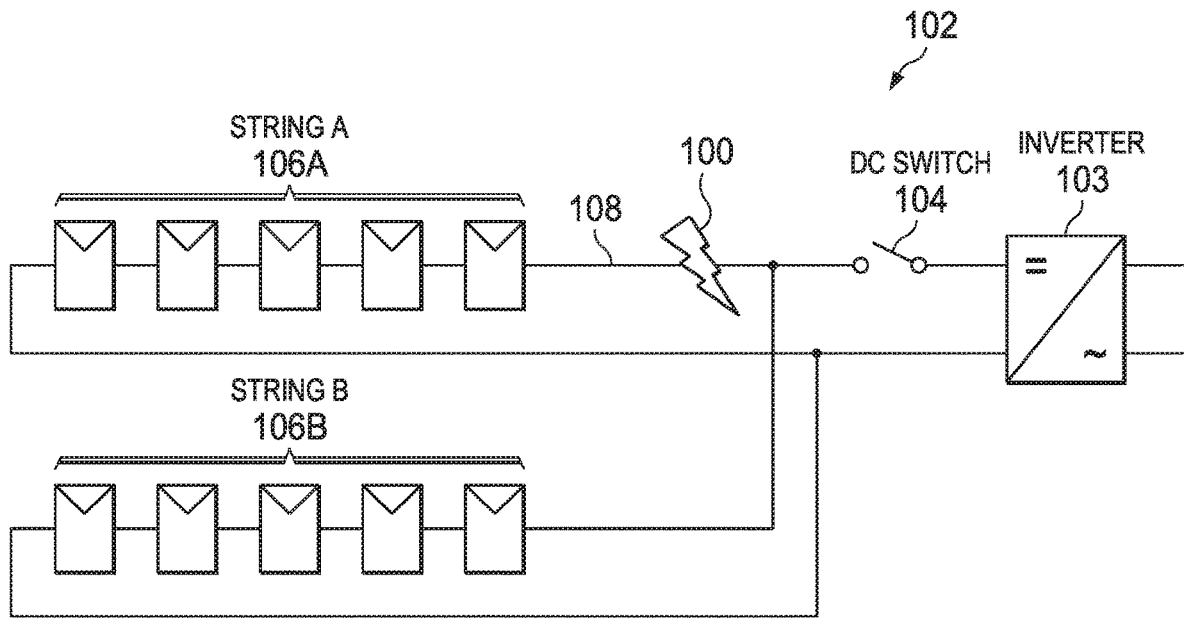
FIG. 1 is a simplified schematic diagram of a PV system illustrating an example occurrence of a series arc in accordance with embodiments described herein.
Figure 2:
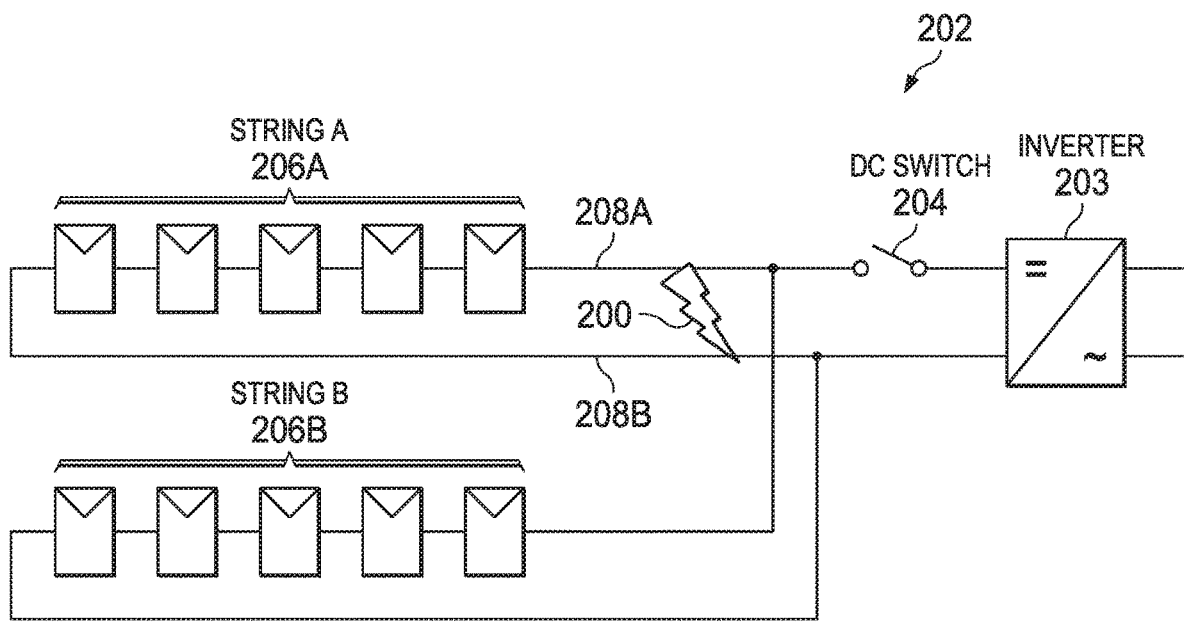
FIG. 2 is a simplified schematic diagram of a PV system illustrating an example occurrence of a parallel arc in accordance with embodiments described herein.

Two different types of arcs may occur in the DC wiring of a PV power generation system. A "series arc" is the result of a failure of the intended continuity of a conductor or connector in an electrical circuit, while a "parallel arc" is the result of an unintended current path between conductors. FIG. 1 illustrates an example of a series arc 100 in a circuit 102 including an inverter 103, a DC switch 104, and two strings of PV modules 106A, 106B. As shown in FIG. 1, the series arc 100 occurs as a failure of intended continuity of a conductor 108 of string 106A. FIG. 2 illustrates an example of a parallel arc 200 in a circuit 202 including an inverter 202, a DC switch 204, and two strings of PV modules 206A, 206B. As shown in FIG. 2, the parallel arc 200 occurs as a result of an unintended current path between a conductor 208A of string 206A and a conductor 208B of string 206B.

Arc faults have been observed or reported in the internal interconnections of PV modules, in the junction boxes on the back of PV modules, and in the conductors and connectors of the DC wiring between strings of PV modules and the inverter. Forensic analysis of PV power generation system failures that lead to fires has shown that the overwhelming majority were caused either by series arc faults or by ground faults. If undetected, a ground fault may contribute to a parallel arc fault, but the best way to prevent this type of failure is to improve the detection of ground faults. Because of this, the PV industry, including relevant code and standards committees, has focused on the detection and mitigation of series arcs in PV systems. To address the danger associated with arcing in PV systems, the U.S. National Electrical Code ("NEC") has mandated that arc fault circuit interrupters ("AFCIs") be included on rooftop systems since 2011 and all systems since 2014. Underwriters Laboratories ("UL") created the Outline of Investigation for listing AFCIs ("UL 1699B"), which requires AFCIs to detect arc-faults between 300 to 900 W.

Figure 3:
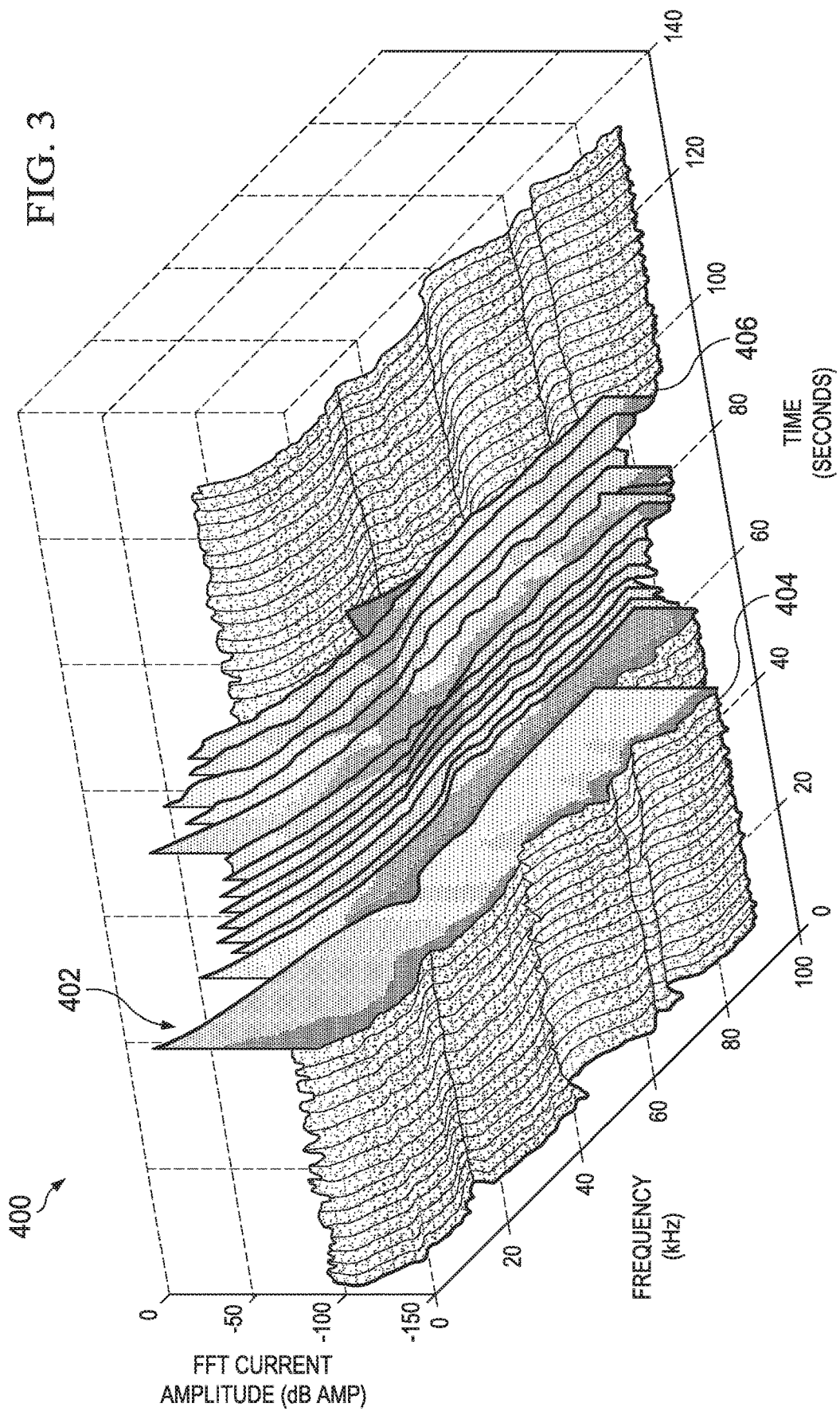
FIG. 3 is a three-dimensional representation of example DC current spectra in which an arc occurred in accordance with features of embodiments described herein.
Figure 4:
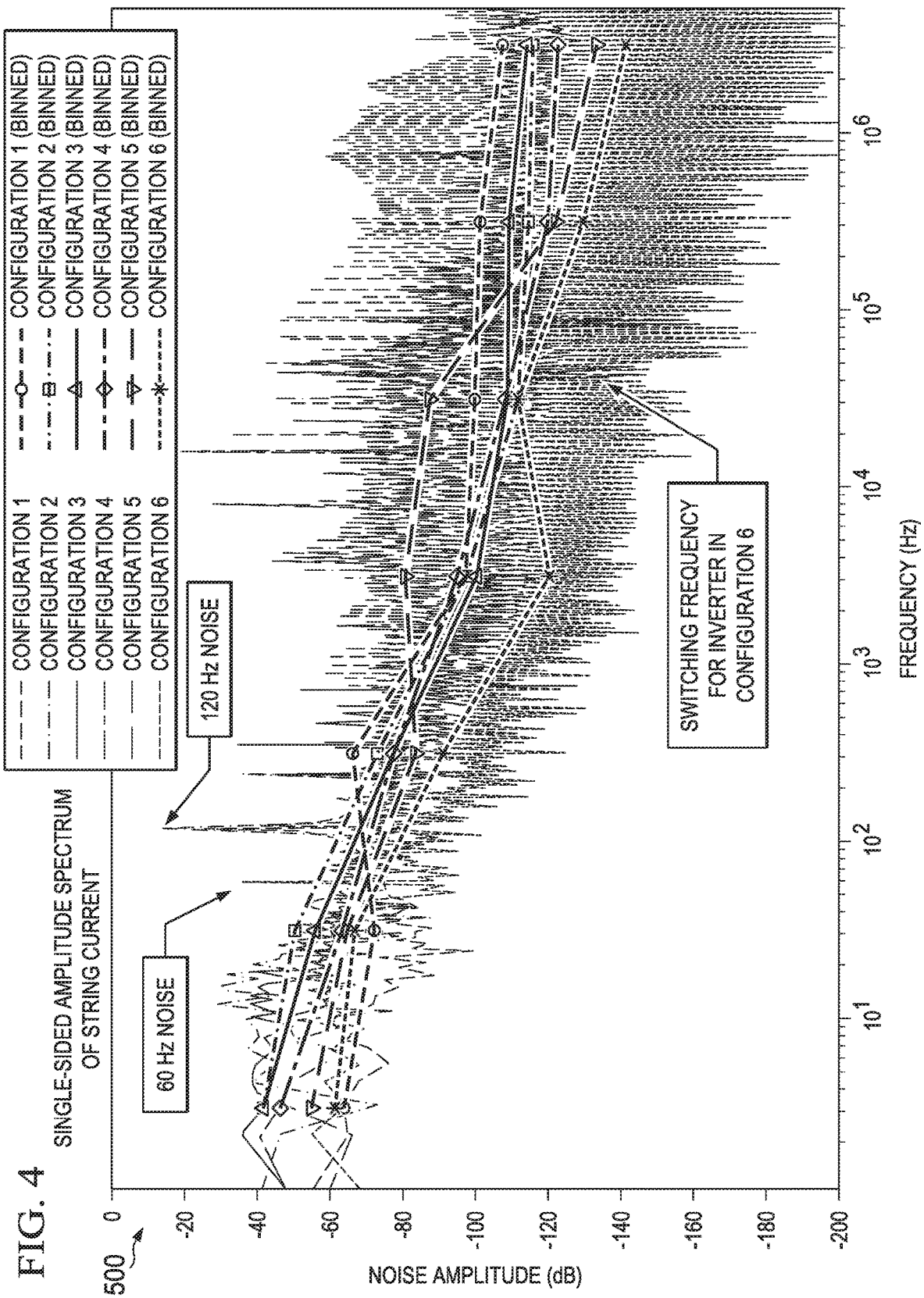
FIG. 4 is a two-dimensional representation of noise in DC current in accordance with features of embodiments described herein.

FIG. 3 illustrates a spectrogram 400 of DC current. As shown in FIG. 3, an arc 402 begins at approximately 40 seconds, indicated in FIG. 3 by a reference numeral 404, and extends until approximately 90 seconds, indicated in FIG. 3 by a reference numeral 406. In other words, FIG. 3 illustrates that there is a rise in the noise floor when an arc occurs. FIG. 4 is a spectrogram 500 illustrating a corresponding noise level of the DC current illustrated in FIG. 3 for a variety of inverter configurations. As apparent from FIG. 4, the noise level rises when the arc 402 occurs. As a result, arc detection algorithms have been developed that observe the spectral content of the DC current to detect the occurrence of an arc. Such algorithms monitor multiple frequencies and flag an arc as having occurred when there is elevated noise content in the majority or all of the monitored frequencies. The variations in noise levels (as shown in FIG. 4) makes it difficult to detect arcs using a single set of reference values for comparison.

To achieve a good detection accuracy, there should be a noticeable difference in noise levels under all operating conditions. As previously noted, the spectrogram 500 of FIG. 4 illustrates noise for various inverter configurations listed in the table of FIG. 3. It will be noted that noise level varies with configuration and reaches near arc noise level for many frequency bands. As a result, it is difficult to select a spectral level that clearly differentiates noise from an arc from noise from other sources.

Challenges of DC arc detection include that noise generated from arc travels through PV module and connectors before reaching the measurement point. The DC cables may not be designed to carry high frequency content and causes variable attenuation on the path. Additionally, antenna effects, crosstalk and other RF phenomena further modify the signal profile and characteristics. Moreover, the inverter generates noise at the inverter's switching frequencies and harmonics The various DC arc detection techniques described in literature may be broadly classified as those that employ time domain signatures and those that employ frequency domain signatures. DC arc detection techniques that employ time domain signatures rely mostly on the arc current signal. Some use statistical properties of the signal, such as mean and variance. Other techniques use the sudden drop in current and still others have reported use of fast change in slope of the current voltages to identify the onset of an arc.

DC arc detection techniques that employ frequency domain signatures typically involve comparison of spectral energy in one or more bands with a threshold to make the decision. An algorithm may use wavelet packets to get energy in particular band and compare the RMS value against a threshold. Regardless of the approach, the choice of thresholds serves an important role; however, most of the proposed techniques are silent as to the exact procedure employed to select the threshold. In at least one technique, the threshold was manually calculated from the experimental results and the procedure for automatic calculation of the threshold was left as future work. Techniques that use properties at transition or onset of arc assume that the signal is continuously sampled, which prevents time division multiplexing of multiple channels.

Embodiments described herein are directed to a computationally inexpensive technique in which both spectral and temporal characteristics of an arc signal are combined, providing good detection performance even in presence of noise. Embodiments are also directed to procedures for calculating parameters needed for decision-making and techniques for adapting those parameters automatically to changes in behavior of an inverter due to various environmental factors.

Figure 5A:
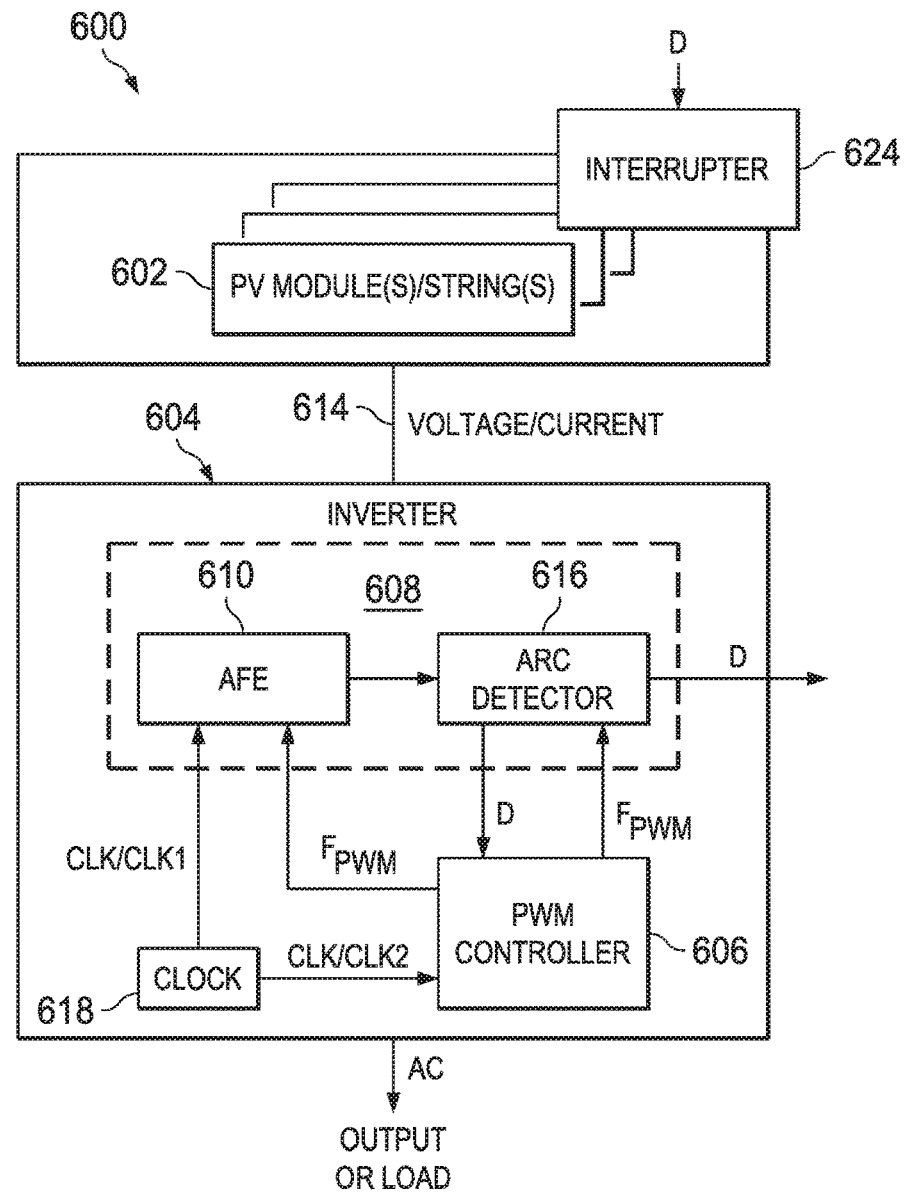
FIGS. 5A-5C are a simplified block diagrams of an arc detection and plant profiling system in accordance with features of embodiments described herein.

FIG. 5A is a schematic block diagram of an illustrative power system 600 having an arc detection and plant profiling system in accordance with features of embodiments described herein. The power system 600, in this example, a photovoltaic ("PV") system, includes one or more PV modules (e.g., solar panels) or one or more strings of PV modules 602 and an inverter 604. Although the system 600 is illustrated as including only a single inverter 604, PV systems having many PV modules 602 may include a plurality of inverters. Inverter 604 may include a pulse-width modulation ("PWM") controller 606, which is semi-conductor or electronic device that may transform DC power into controlled AC power using PWM. The PWM controller 606 may include circuitry for controlling functions, as well as circuitry for generating a pulse width modulation waveform having the switching frequency (e.g., including a control loop or scheduler which affects the PWM waveform). PWM switching is an efficient way to precisely regulate power level, but the transients of switching devices in the PWM controller 606 may generate switching interference (harmonics in the spectrum) in the power system 600, which may affect arc detection and arc detector design.

Figure 5B:
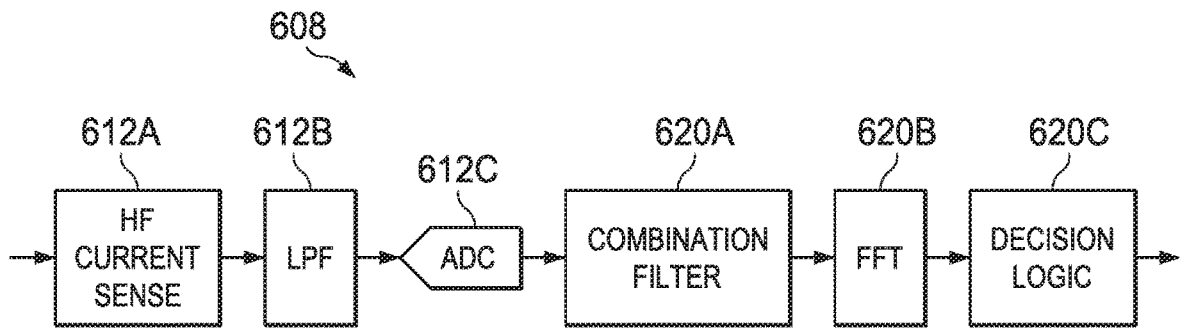

In addition to the PWM controller 606, the inverter may include an arc detection and plant profiling system 608. The arc detection and plant profiling system 608 may include an analog front end ("AFE") 610 and an arc detector 616. As shown in FIG. 5B, the AFE 610 (analog or mixed signal processing) includes a high frequency ("HF") current sensor 612A for sensing the signal on a power line 614 and providing it to a low pass filter ("LPF") 612B, which filters the sensed signal and provides the filtered signal to an analog-to-digital converter ("ADC") 612C, which receives the filtered signal (voltage or current) as input and provide digital samples as output. The ADC 612C may sample a first signal on a first power line 614 to generate a plurality of first digital samples at a sampling frequency coherent with a switching frequency of a pulse width modulation controller of the inverter. As also shown in FIG. 5B, the arc detector 616 (digital signal processing) may include a comb filter 620A for attenuating spectral energy corresponding to the switching frequency, and a fast Fourier transform ("FFT") module 620B for transforming a first window of the first digital samples (as input) to a first frequency-domain representation (as output). Depending on whether signal conditioning is applied to the digital samples prior to the FFT, the input to the FFT module 620B may include the original first digital samples or a derivation of the first digital samples (processed/filtered version). The arc detector 616 further includes decision logic 622 for performing the various techniques described herein for arc detection and plant profiling.

Referring again to FIG. 5A, when an arc fault is detected, the arc detector 616 may output a signal D which may trigger one or more action(s) such as turning on an indicator light, sounding an alarm, shutting down an inverter, signaling to the PWM controller 606, triggering a circuit interrupter 624, disconnecting a PV module from the string, etc.

Integrating the arc detection and plant profiling system 608 into the inverter 604 provides numerous technical advantages. The arc detection and plant profiling system 608 may perform better (improve signal conditioning and/or improve classification) if the switching frequency F_PWM is known. The PWM controller 606 may provide F_PWM or switching frequency information to arc detector 616. In some embodiments, the PWM switching frequency F_PWM would be available to the arc detector system 616, so that the ADC 612C may adjust its sampling frequency to ensure coherent sampling. Furthermore, integrating the arc detection and plant profiling system 608 to be in the same inverter as the PWM controller 606 means that the ADC 612C and the PWM controller 606 may be clocked by a same clock signal CLK, or clock signals CLK1 and CLK2 (respectively). The clock signals CLK1 and CLK2 may be generated based on the same root clock for coherent sampling. A common clock generator 618 (i.e., thus having a common clock crystal) generating a clock signal CLK, or in some embodiments, generating two clock signals CLK1, CLK2, may be used for both the ADC 612 and portions of PWM controller 606 for generating a PWM waveform.

Figure 5C:
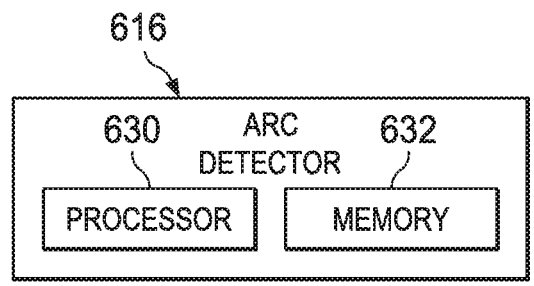

FIG. 5C shows exemplary hardware for providing an arc detector, such as arc detector 616, according to some embodiments of the disclosure. One or more parts or processes of the arc detector (e.g., as illustrated by FIGS. 5A and 5B and particularly decision logic 622) may be implemented or executed by a processor 630, carrying out instructions stored on memory 632. Data such as the digital samples and the frequency-domain representations ("FFT captures") may be stored on memory 632 as well.

Parts of various apparatuses for arc detection may include electronic circuitry to perform the functions described herein. In some cases, one or more parts of the apparatus may be provided by a processor specially configured for carrying out the functions described herein. For instance, the processor may include one or more application specific components, or may include programmable logic gates which are configured to carry out the functions describe herein. The circuitry may operate in analog domain, digital domain, or in a mixed signal domain. In some instances, the processor may be configured to carrying out the functions described herein by executing one or more instructions stored on a non-transitory computer medium.

In one example embodiment, any number of electrical circuits of the FIGS. 5A and 5B may be implemented on a board of an associated electronic device, e.g., an inverter. The board may be a general circuit board that may hold various components of the internal electronic system of the electronic device and, further, provide connectors for other peripherals. More specifically, the board may provide the electrical connections by which the other components of the system may communicate electrically. Any suitable processors (inclusive of digital signal processors, microprocessors, supporting chipsets, etc.), computer-readable non-transitory memory elements, etc. may be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGS. 5A and 5B may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip ("SOC") package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module ("MCM"), with a plurality of separate ICs located within a single electronic package and configured to interact closely with each other through the electronic package. In various other embodiments, the arc detection functionalities may be implemented in one or more silicon cores in Application Specific Integrated Circuits ("ASICs"), Field Programmable Gate Arrays ("FPGAs"), and other semiconductor chips.

The methods described herein make use of two key properties of arcing signals: (1) The magnitude of high frequency spectral components of DC current increases for all bands when an arc occurs, continues as long as the arc is present, and is most noticeable in the range 20 KHz to 100

KHz; and (2) the relative magnitude of a spectral component in various frequency bands remains the same for the duration of the arc.

Figure 6A:
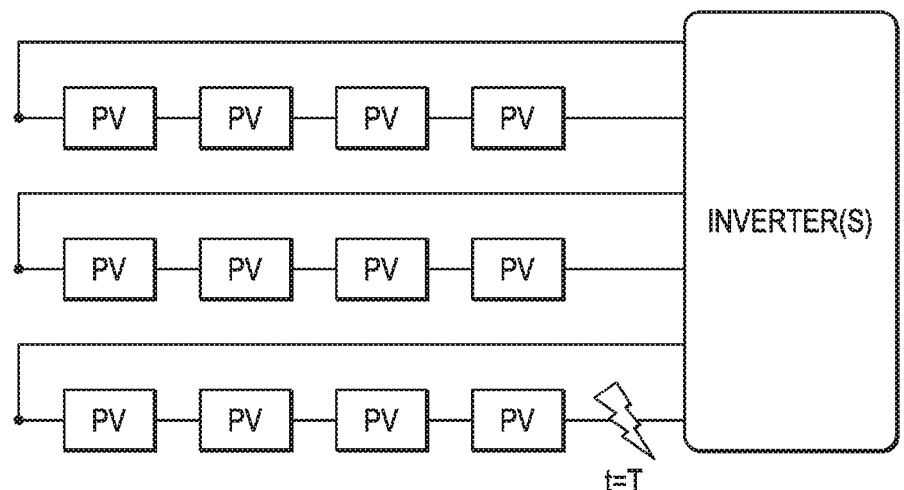
FIG. 6A is a simplified block diagram of an exemplary power system illustrating a transient noise source on a string of photovoltaic panel, according to some embodiments of the disclosure.

While coherent sampling and signal conditioning of the digital samples helps reduce smearing, other noise sources may potentially affect the accuracy of the arc detector, or cause false positives. FIG. 6A shows an exemplary power system illustrating a transient noise source (depicted as a bolt) on multiple strings of photovoltaic panels, according to some embodiments of the disclosure. The power system, in this example, has three PV strings and one or more inverters. When an actual arc fault occurs at t=T, the spectrum would most likely change state from having a non-arcing signature to an altered state having an arcing signature. One would expect the spectrum would stay in the altered state until the arc fault is removed. In contrast, when a transient noise source is present, the spectrum may change to an altered state for a very short duration and returns to the non-arcing state. It is important that an arc fault is not detected in the presence of such noise source. To address noise sources that affect the spectrum only for a short period of time ("transients"), the arc detector may include a time-domain averaging part for averaging values for a particular bin over a plurality of frequency-domain representations (a (programmable) window of FFT captures) to generate a time-domain average of a power spectrum of the power system, and a classifier may classify whether the arc fault is present based further on the time-domain average. The time-domain average may smooth out any transients which are not likely to be associated with arc faults, and thus prevent those transient noise sources from causing a false positive.

Figure 6B:
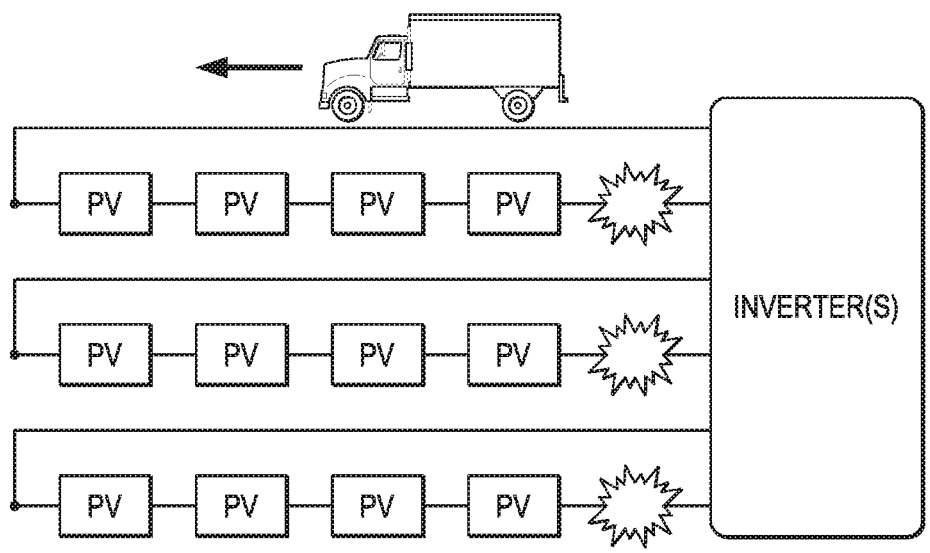
FIG. 6B is a simplified block diagram of an exemplary power system illustrating a global noise source on multiple strings of photovoltaic panels, according to some embodiments of the disclosure.

Besides transient noise sources, other global noise sources may affect arc detection. FIG. 6B shows an exemplary power system for illustrating a global noise source on a string of photovoltaic panels affecting arc detection, according to some embodiments of the disclosure. The power system, in this example, has three PV strings and one or more inverters. If a global noise source is present, e.g., a truck driving by the three PV strings and changing the respective spectra at the same time, an arc detector could potentially detect arcing when arcing is not actually present and shuts down all three PV strings unnecessarily. Assuming that arcing is more likely to occur on one PV string at a given time, and such global noise source would disturb all three spectra corresponding to the three PV strings at the same time (e.g., whose signals on the power lines are sampled and converted into FFT captures separately), a classifier may leverage multiple FFT captures associated with multiple PV strings at a given time to reject false positives caused by global noise sources. For instance, a classifier may classify whether the arc fault is present in the power system based on a plurality of frequency domain representations, including (1) a first frequency-domain representation generated based on a first window of first digital samples of a first signal of a first power line and (2) a second frequency-domain representation generated based on a second window of second digital samples of a second signal of a second power line in the same power system as the first power line. If both the first and second frequency-domain representations trigger arc detection, the classifier may override or disregard such concurrent triggers, since concurrent triggers is not very likely to be associated with an actual arc fault (more likely to occur on one power line only). In some embodiments, the overriding of concurrent triggers is more restricted. For instance, the classifier may only over ride concurrent triggers if the triggers originated from the same frequency bin, assuming global noise sources would appear on multiple spectra at a fixed frequency band or frequency bin.

The following definitions are used throughout the disclosure:

comb filter: filter of the form $$y[n]=x[n]+\alpha x[n-K] \quad (1)$$

it will be assumed for purposes of example herein that $\alpha=1$.

frame: collection of samples from the ADC. The number of samples "N" is defined as $$N=M+K \quad (2)$$

where M—Length of FFT K—Length of comb filter.

magnitude spectra: the magnitude of fast Fourier transform ("FFT") output of a frame.

bin: indicates index of output of FFT of a frame. If sampling rate of ADC is $F_s$ and FFT length is M, $n^{th}$ bin corresponds to a frequency $n*F_s/M$.

candidate bin: a bin whose magnitude spectra value is larger than pre-configured reference value under. The increase could be due to noise or an arc.

normal bins: a bin that is not a candidate bin.

cluster: a collection of consecutive candidate bins. A frame may have one or multiple clusters.

cluster size: the number of bins in a cluster.

candidate cluster: a cluster with cluster size greater than a configuration value minimum cluster size.

frame status: a frame may be one of two types, including a candidate frame and a normal frame.

candidate frame: a frame that shows similar spectral characteristics as noise from an arc.

arc status: there are two types of arc status, including arc detected and arc not detected.

reference spectra: stored reference values of magnitude spectra used for comparison to decide candidate bins.

plant profiling: the process of identifying reference spectra for a PV inverter installation.

Referring again to FIG. 5B, the high frequency content of a DC link current is sensed by current sensor 612A, which may be implemented using a shunt, a Rogowski coil, or a current transformer ("CT"). The sensed current is lowpass filtered by LPF 612B to avoid anti-aliasing and is amplified before being input to ADC 612C. It will be recognized that the magnitude of high frequency spectral components of DC current increases when an arc occurs and that the increase is most noticeable in the range 20 KHz to 100 KHz; therefore, the sampling frequency should be selected such that it accurately represents the spectral component up to 100 KHz. In accordance with features of embodiments escribed herein, a sampling frequency of 500 KHz to 600 KHz is used so that the LPF 612B has large transition band and may be implemented inexpensively. The exact sampling frequency is selected such that it is an integral multiple of switching noise frequency of the inverter. The comb filter 620A should be configured to remove the inverter switching noise frequency. The length K of comb filter is calculated as:

$$K=F_s/F_n \quad (3)$$

where $F_s$ is the sampling frequency and $F_n$ is the switching frequency.

In its simplest form, the detection algorithm/decision logic 620C compares the magnitude spectra against a reference in the frequency range 20 KHz to 100 KHz. If the magnitude spectra at any bin exceeds the reference, an arc warning may be issued. It will be recognized that it is difficult to identify a reference level that cleanly separates noise from other sources and arc; therefore, the properties of arcing noise need to be evaluated before a reference level is selected. It has been observed that in the event of an arc, even though there is increase in spectral content that occurs on entire frequency range, the highest energy bins are concentrated in a small band of bins. The exact range of the band and magnitude varies with the location of the arc and the environment; however, the location of the band of bins remains more or less same from one frame to another. This property may be used to predict the occurrence of arcs more accurately. The detailed algorithm for accomplishing this is illustrated in the flow diagrams of FIGS. 7-11.

Figure 12:
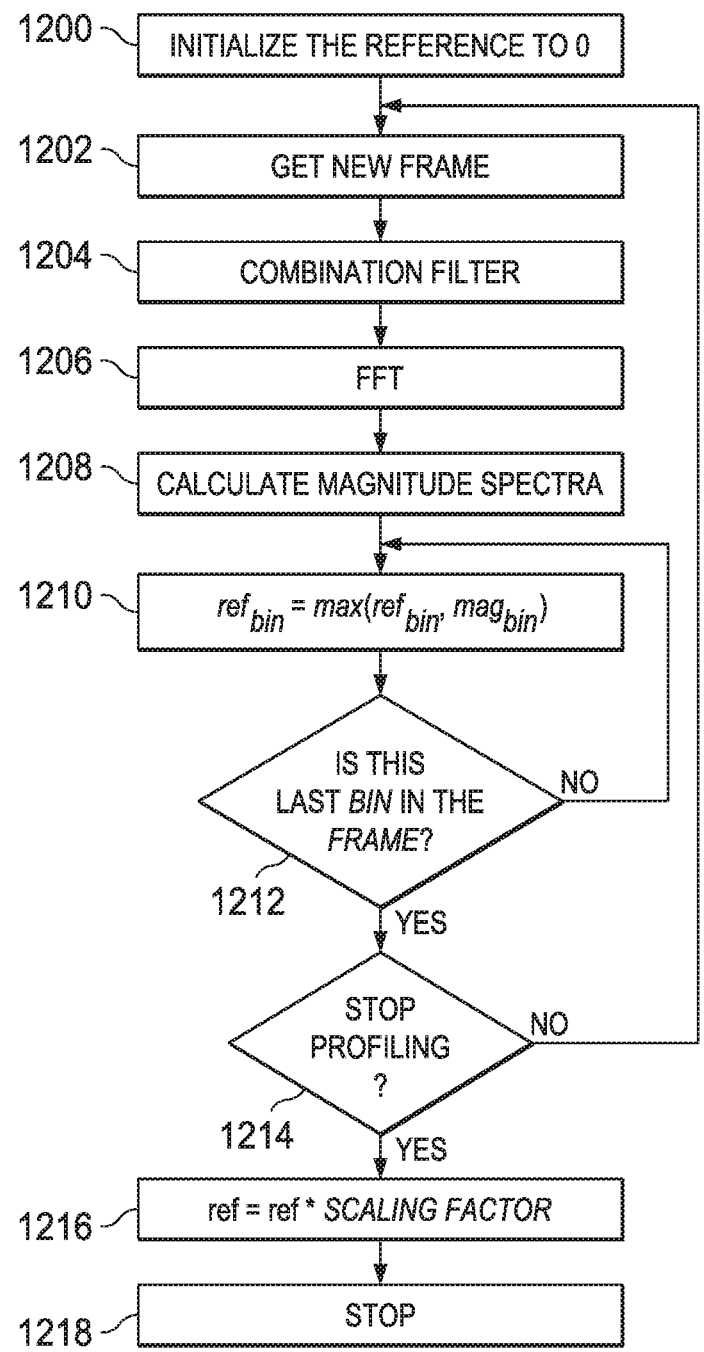
FIG. 12 is a flowchart illustrating logic for calculating a reference magnitude spectrum that may be implemented by the arc detection and plant profiling system of FIGS. 5A-5C in accordance with features of embodiments described herein.

The concept of plant profiling in accordance with embodiments described herein will now be described. As previously noted, the noise generated in DC link frequency varies with the inverter and other environmental factors; therefore, it is important that the reference magnitude spectrum level that separates the other noise from arc noise be calculated separately for each installation. This process is refereed as "plant profiling." A simple algorithm for calculating a reference magnitude spectrum is illustrated in FIG. 12. In general, the algorithm looks for the maximum value of the magnitude spectra occurring during normal operation and applies a scaling factor to allow for additional noise. If the algorithm if run for a sufficient duration, the maximum of all noise in the DC link in the system may be captured. If noise greater than the reference is detected, it indicates a high probability of an arc. This type of plant profiling works well if the noise during profiling is low; however, the reference determined using this technique will be biased on the higher side, thereby preventing detection of weak arcs. Consider for example that a hypothetical noise in the form of frequency sweep ranging from 20 KHz to 100 KHz occurs during profiling. Each frame will have tones of one frequency and the reference will be corrupted by the magnitude spectra of these tones.

Figure 13:
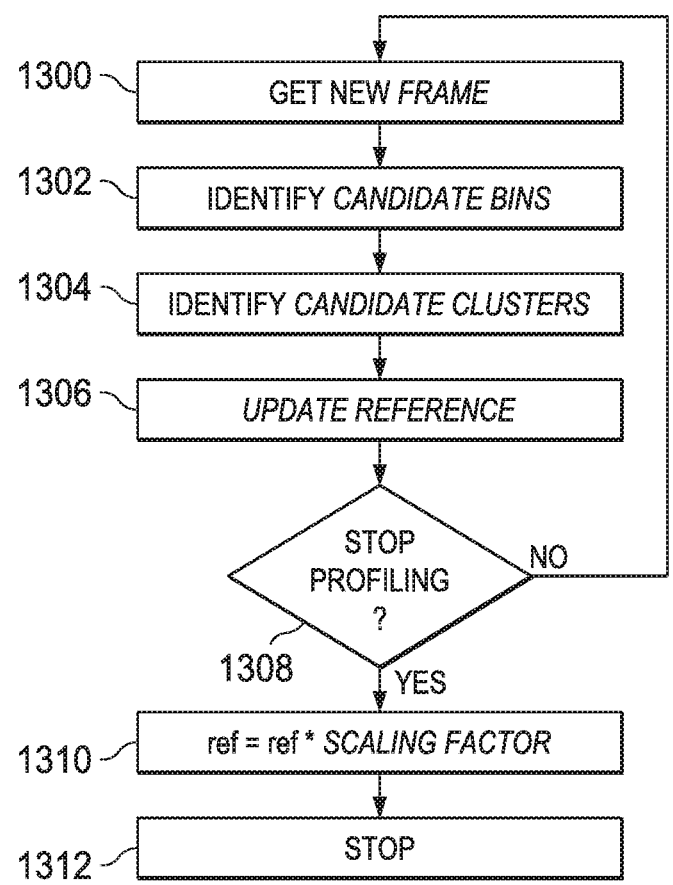
FIG. 13 is a flowchart illustrating plant profiling logic that may be implemented by the arc detection and plant profiling system of FIGS. 5A-5C in accordance with features of embodiments described herein.
Figure 14:
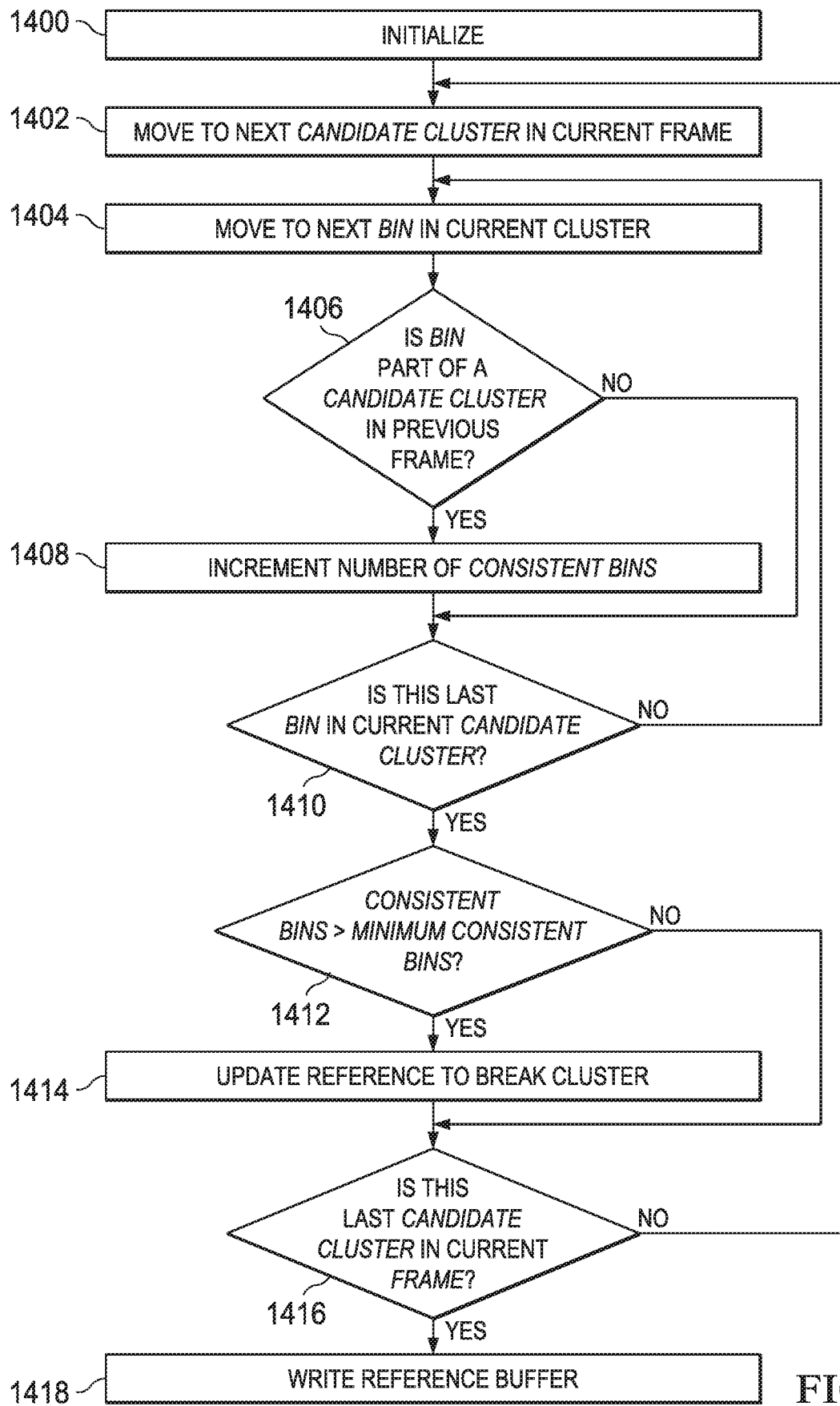
FIG. 14 is a flowchart illustrating logic for updating a reference to break a cluster in connection with the plant profiling logic of FIG. 13.
Figure 16:
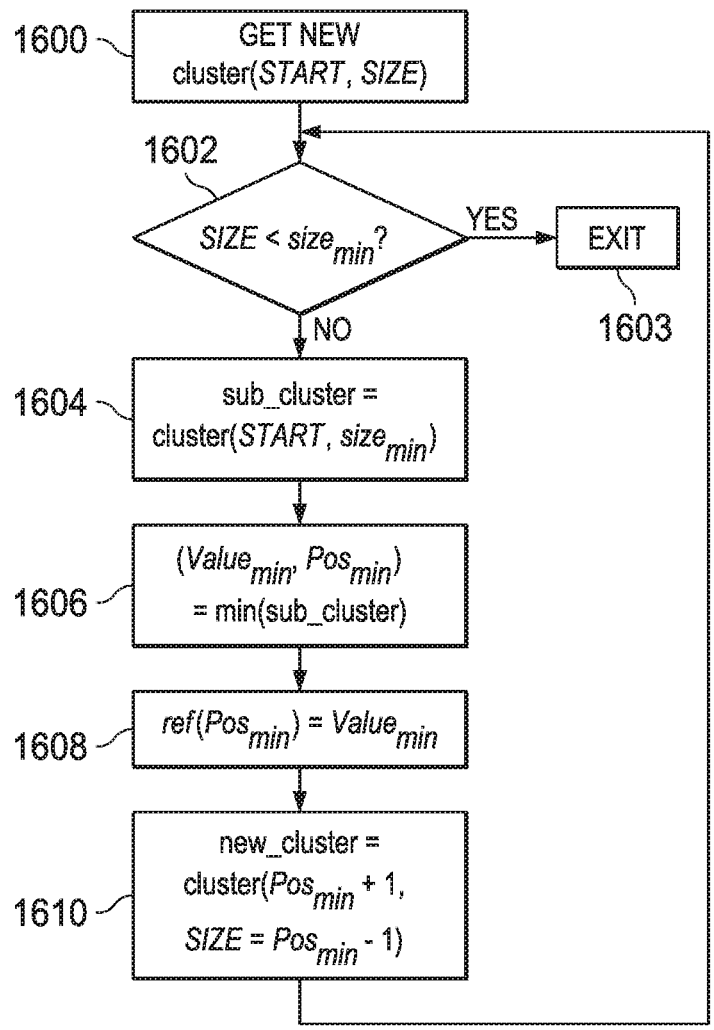
FIG. 16 is a flowchart illustrating a procedure for breaking a cluster in connection with the plant profiling logic of FIG. 13.

A technique for performing plant profiling is illustrated in FIG. 13. As shown in FIG. 13, the technique looks only for noise that matches the property of arcing noise and updates the reference accordingly. For each cluster identified in a non-arc signal, the technique updates the reference such that the cluster incorrectly identified as an arc will be broken. The reference may be updated in many ways to break the cluster, such as illustrated in FIG. 14, but it is important that the reference be increased only for the required bin and only up to the required value. An example procedure for breaking a cluster is illustrated in FIG. 16. Since the properties for switching noise and other interference is different from arcing noise, the system will be robust to the influence of such signals during profiling.

Figure 15:
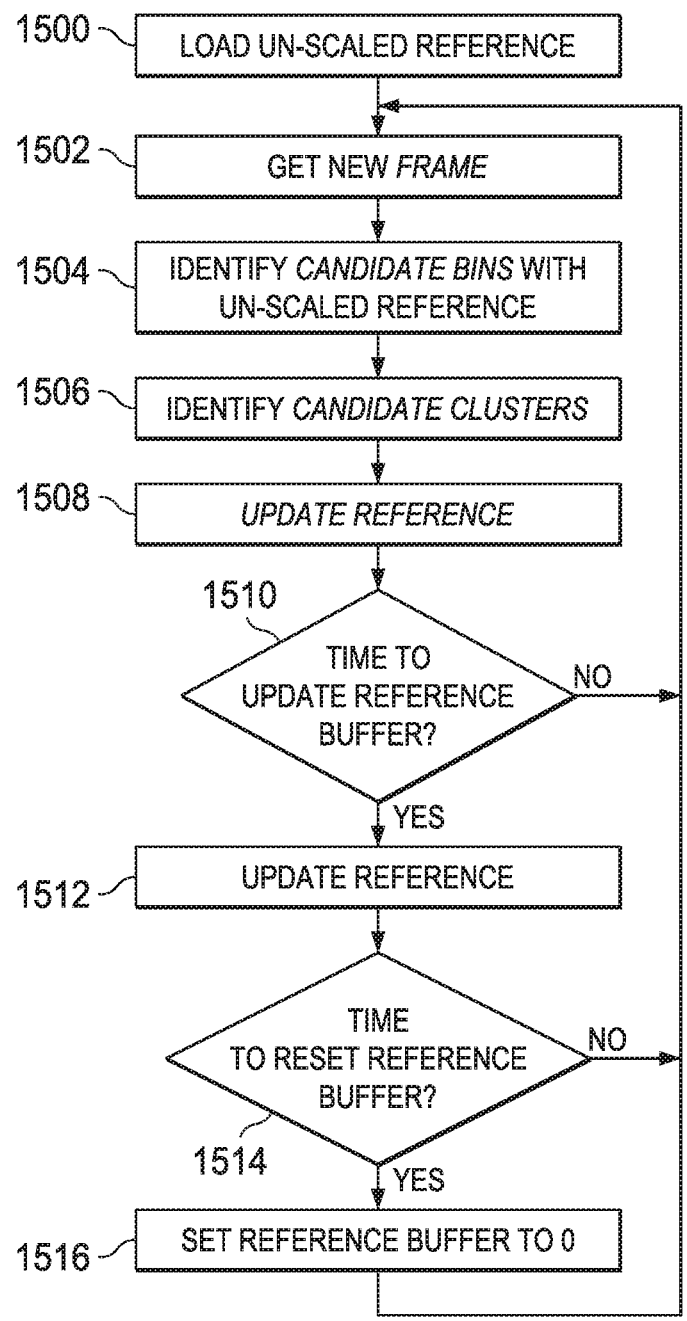
FIG. 15 is a flowchart illustrating modified plant profiling logic for execution in concert with the arc detection decision logic of FIG. 7.

Noise properties in the inverter vary with the environment in which the inverter is deployed and should be regularly updated to provide the correct arc status. The proposed plant profiling technique includes many steps in common with the detection technique; therefore, it is computationally inexpensive to run every time with unscaled reference. The algorithm may be configured to update the reference after every "N" hours of profiling. Additionally and/or alternatively, the system may be configured to reset the profile to limit the propagation or accumulation of noise over a long period. The profiling algorithm modified to run along with detection is illustrated in FIG. 15.

Figure 7:
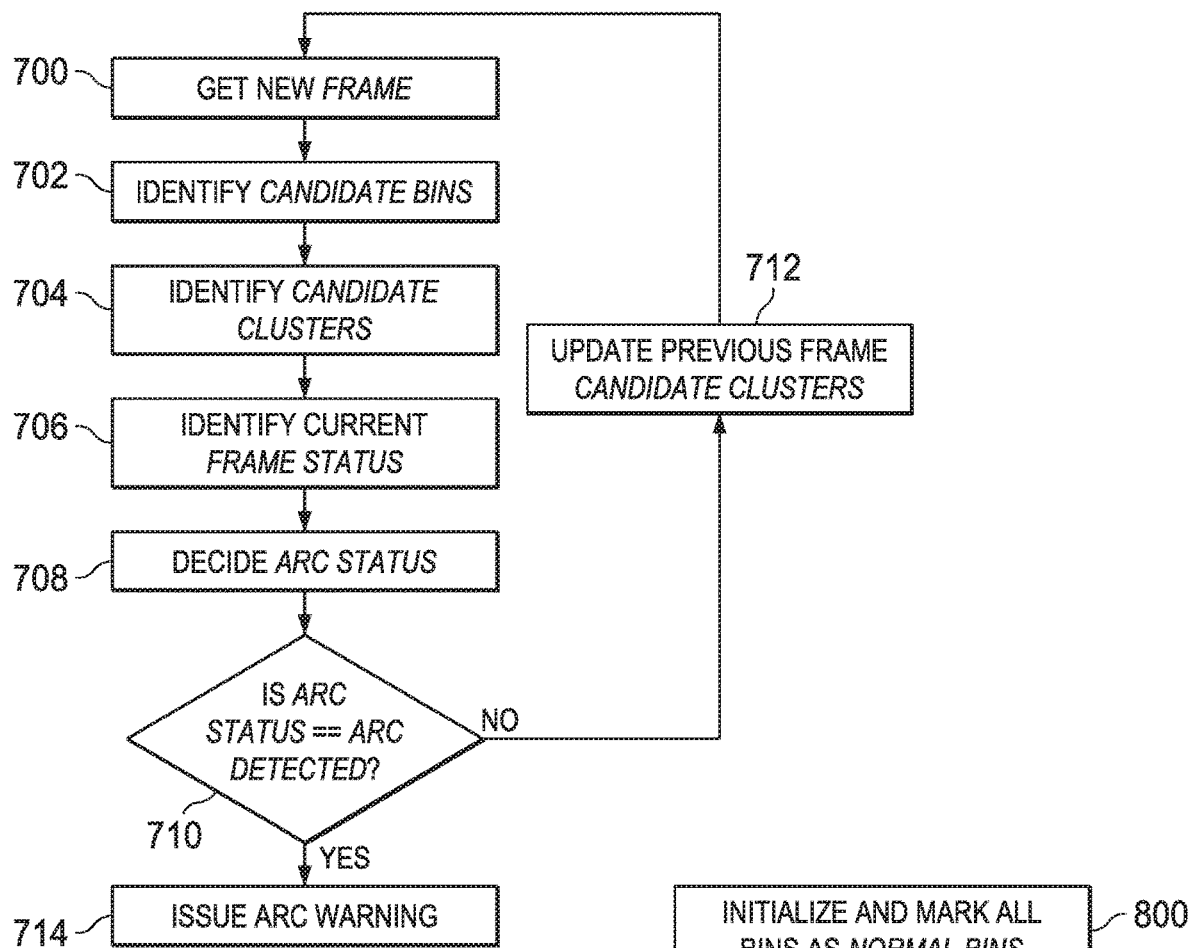
FIG. 7 is a flowchart illustrating arc detection decision logic that may be implemented by the arc detection and plant profiling system of FIGS. 5A-5C in accordance with features of embodiments described herein.
Figure 8:
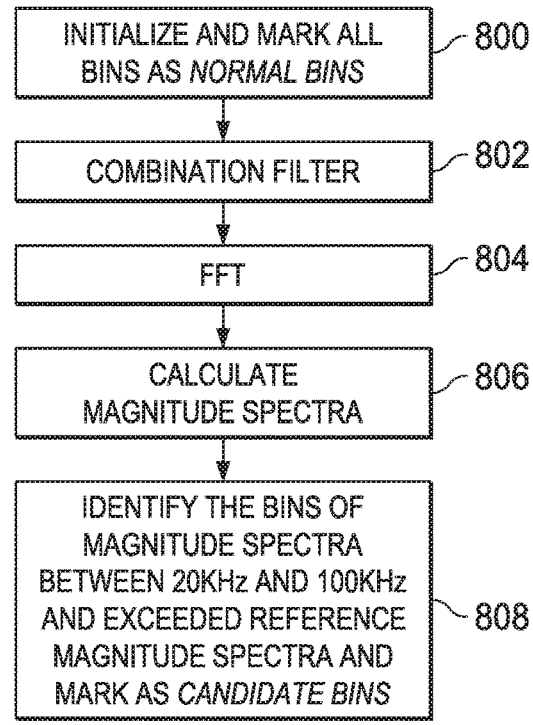
FIG. 8 is a flowchart illustrating logic for identifying candidate bias in connection with the arc detection decision logic of FIG. 7.
Figure 9:
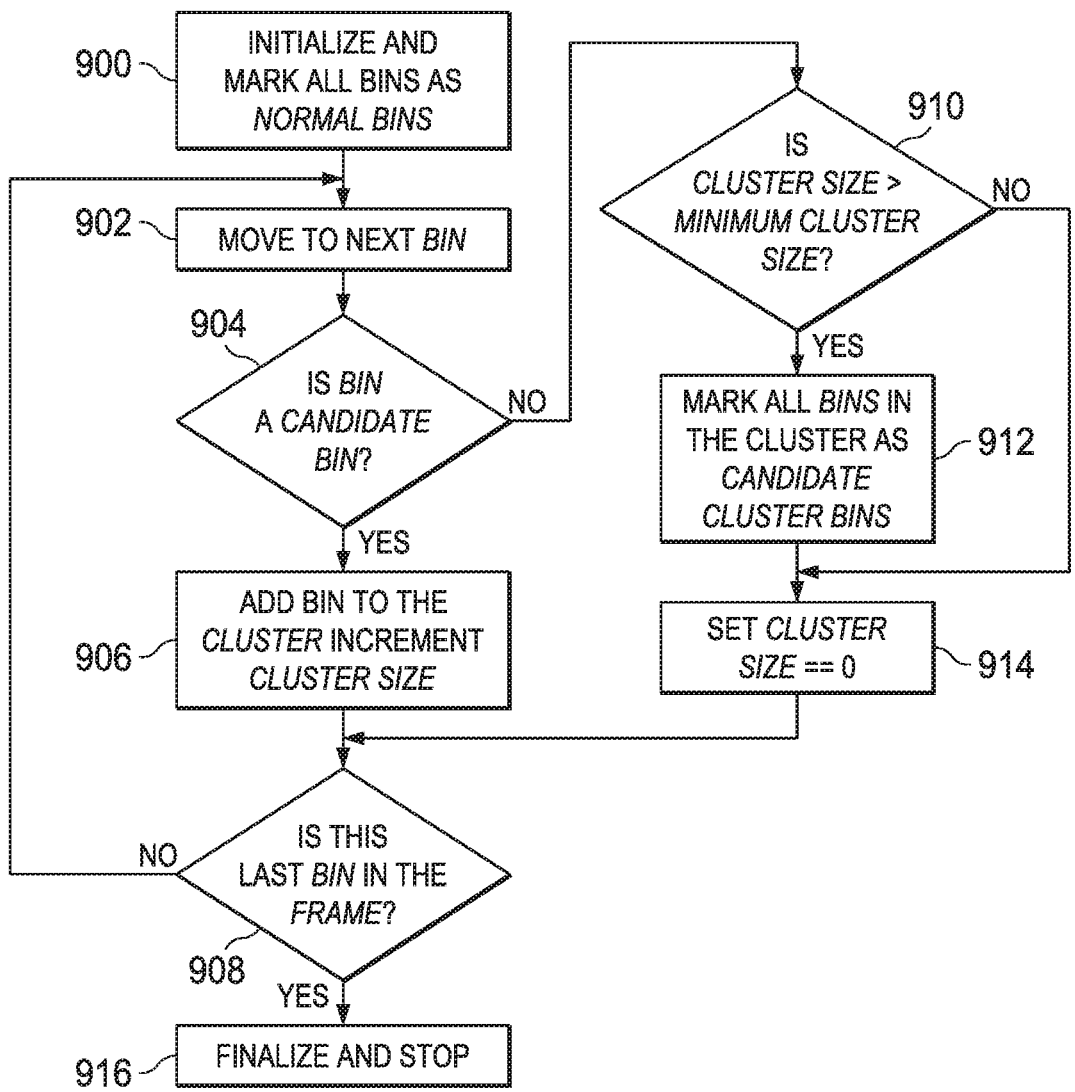
FIG. 9 is a flowchart illustrating logic for identifying candidate clusters in connection with the arc detection decision logic of FIG. 7.
Figure 10:
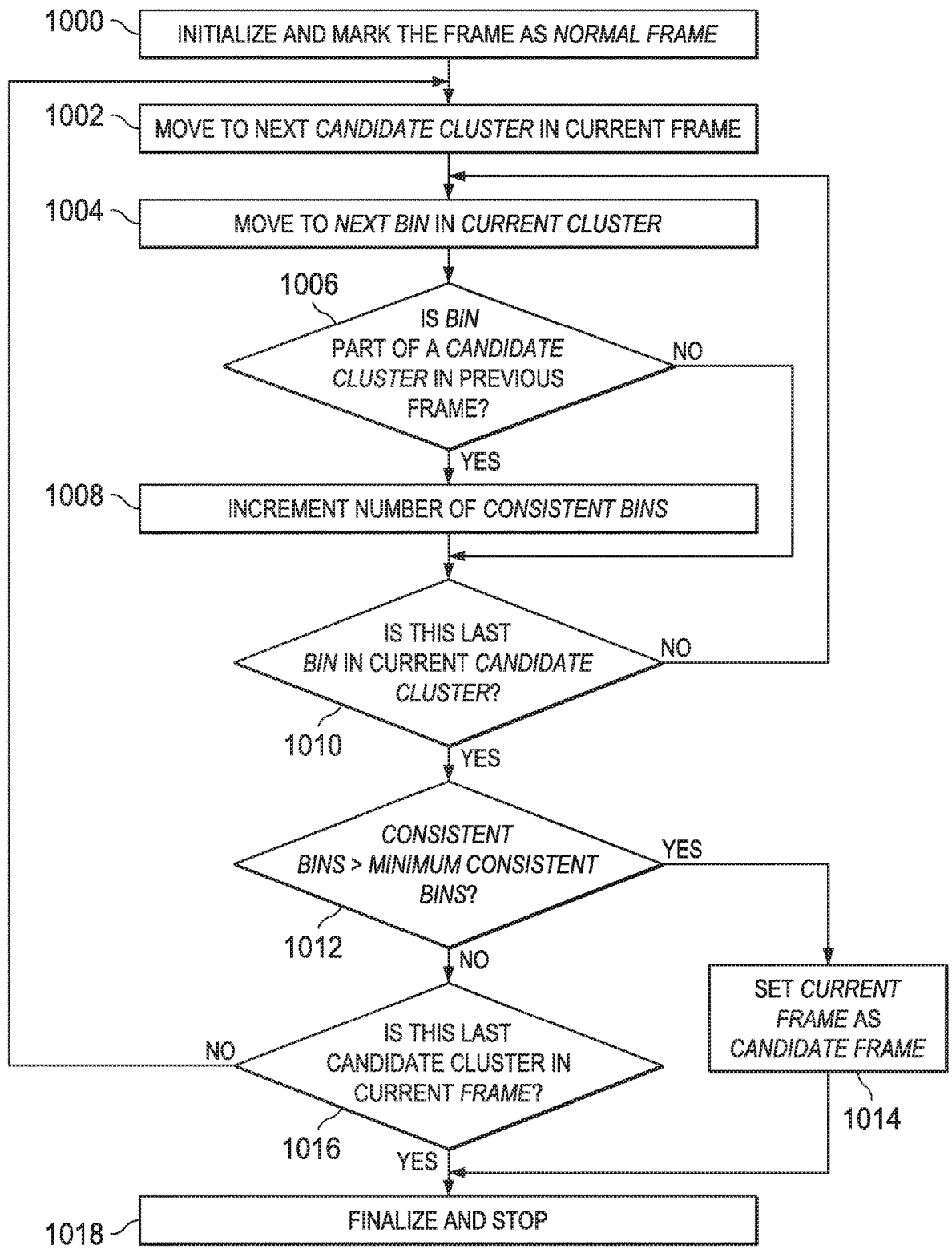
FIG. 10 is a flowchart illustrating logic for identifying frame status in connection with the arc detection decision logic of FIG. 7.
Figure 11:
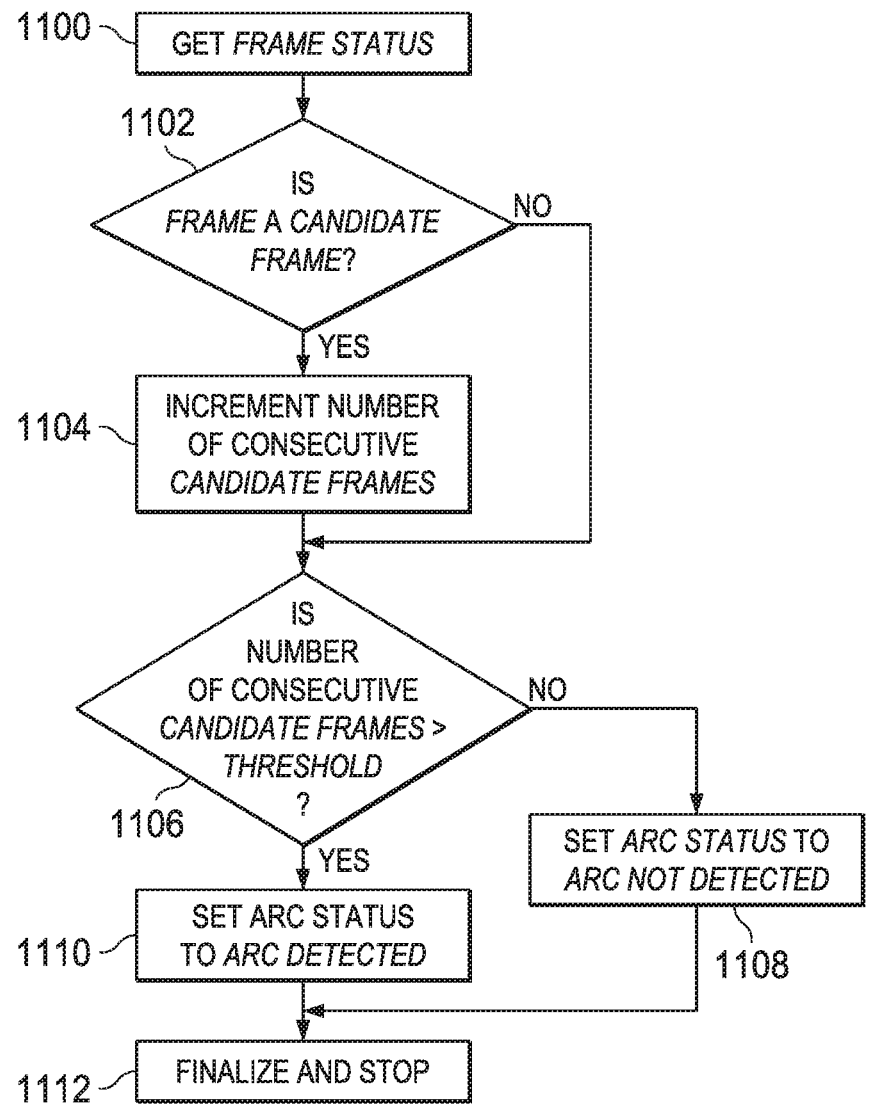
FIG. 11 is a flowchart illustrating logic for identifying arc status in connection with the arc detection decision logic of FIG. 7.

Referring again to FIG. 7, illustrated therein is a flowchart showing arc detection decision logic that may be implemented by the arc detection and plant profiling system of FIGS. 5A-5C in accordance with features of embodiments described herein. As shown in FIG. 7, in step 700, a new frame is obtained and identified as the current frame. In step 702, candidate bins of the current frame are identified (FIG. 8). In step 704, candidate clusters of the identified candidate bins are identified (FIG. 9). In step 706, current frame status for the current frame is determined (FIG. 10). In step 708, arc status for the current frame is determined (FIG. 11). In step 710, a determination is made whether the determined arc status is "arc detected." If not, execution proceeds to step 712, in which the candidate clusters for the current frame are updated, and then returns to step 700 to obtain another frame. If a positive determination is made in step 710, execution proceeds to step 714, in which an arc warning is issued and appropriate steps may be taken.

Referring again to FIG. 8, illustrated therein is a flowchart showing logic for identifying candidate bias in connection with the arc detection decision logic of FIG. 7. In step 800, all bins of the current frame are initialized and marked as "normal bins." In step 802, the comb filter is applied on a frame and removes particular frequencies, such as switching frequencies and associated harmonics, from the signal. The output of the comb filter is a set of samples. In step 804, the FFT is applied to the filtered signal. In step 806, magnitude spectra is calculated for each bin. In step 808, bins having a magnitude spectra between a low threshold (e.g., 20 KHz) and a high threshold (e.g., 100 KHz) and exceeding the reference magnitude spectra are identified and marked as "candidate bins."

Referring again to FIG. 9, illustrated therein is a flowchart showing logic for identifying candidate clusters in connection with the arc detection decision logic of FIG. 7. In step 900, all bins are initialized and marked as "normal." In step 902, a next bin is identified as the current bin. In step 904, a determination is made whether the current bin identified in step 902 is a candidate bin. If so, execution proceeds to step 906, in which the current bin is added to a current cluster and the value of cluster size is incremented by 1. Execution then proceeds to step 908, in which a determination is made whether the bin is the last bin in the frame. If not, execution returns to step 902 and the next bin in the frame is identified as the current bin. If a negative determination is made in step 904, meaning that the end of a cluster has been reached, execution proceeds to step 910, in which a determination is made whether the value of cluster size is greater than the value of minimum cluster size. If so, execution proceeds to step 912, in which all bins in the cluster are marked as candidate cluster bins, and then to step 914, in which cluster size is set to 0. Execution then proceeds to step 908. If a positive determination is made in step 908, execution proceeds to step 916, in which the process terminates. If a negative determination is made in step 910, indicating that the cluster does not meet the size requirements to be considered a candidate cluster, execution proceeds to step 914.

Referring again to FIG. 10, illustrated therein is a flowchart showing logic for identifying frame status in connection with the arc detection decision logic of FIG. 7. In particular, the process illustrated in FIG. 10 checks whether candidate clusters span the same bins as the previous frame and the current frame. This is referred to as "consistency." If the number of overlapping bins exceeds a minimum threshold, the current frame is deemed a candidate frame. Execution begins in step 1000, in which the frame is initialized and marked as a "normal" frame. In step 1002, the next candidate cluster in the frame is identified as the current cluster. In step 1004, the next bin in the current cluster is identified as the current bin. In step 1006, a determination is made whether the current bin is part of a candidate cluster in a previous frame. If so, execution proceeds to step 1008, in which the value of candidate bins is incremented, and then to step 1010. If a negative determination is made in step 1006, execution proceeds directly to step 1010. In step 1010, a determination is made whether the current bin is the last bin in the current candidate cluster. If not, execution returns to step 1004; otherwise, execution proceeds to step 1012. In step 1012, a determination is made whether the value of consistent bins is greater than the value of minimum consistent bins. If so, execution proceeds to step 1014, in which the current frame is identified as a candidate frame. If a negative determination is made in step 1012, execution proceeds to step 1016, in which a determination is made whether the candidate cluster is the last one in the current frame. If so, execution proceeds to step 1018, in which the process terminates; similarly, upon completion of step 1014, execution proceeds to step 1018. If a negative determination is made in step 1016, execution returns to step 1002.

Referring again to FIG. 11, illustrated therein is a flowchart showing logic for identifying arc status in connection with the arc detection decision logic of FIG. 7. In step 1100, frame status of the current frame is obtained. In step 1102, a determination is made whether the current frame is a candidate frame. If so, execution proceeds to step 1104, in which the number of consecutive candidate frames is incremented. Execution then proceeds to step 1106. If a negative determination is made in step 1102, execution proceeds directly to step 1106. In step 1106, a determination is made whether the number of consecutive candidate frames is greater than a predetermined threshold. If not, execution proceeds to step 1108, in which arc status is set to "arc not detected." If a positive determination is made in step 1106, execution proceeds to step 1110, in which arc status is set to "arc detected." Upon completion of either of steps 1108 or 1110, execution terminates in step 1112.

Referring again to FIG. 12, illustrated therein is a flowchart showing for calculating a reference magnitude spectrum ("ref") that may be implemented by the arc detection and plant profiling system of FIGS. 5A-5C in accordance with features of embodiments described herein. In step 1200, the value of ref is initialized to 0. In step 1202, a new frame is identified. In step 1204, the comb filter is applied to the frame. In step 1206, the FFT is applied to the filtered frame. In step 1208, the magnitude spectra is calculated for the frame. In step 1210, $ref_{bin}$ is set to equal the max($ref_{bin}$, $mag_{bin}$). In step 1212, a determination is made whether the current bin is the last bin in the frame. If not, execution returns to step 1210; otherwise, execution proceeds to step 1214, in which a determination is made whether to stop profiling. If not, execution returns to step 1212; otherwise, execution proceeds to step 1216. In step 1216, ref is set to equal ref multiplied by a scaling factor. Execution then terminates in step 1218.

Referring again to FIG. 13, illustrated therein is a flowchart showing plant profiling logic that may be implemented by the arc detection and plant profiling system of FIGS. 5A-5C in accordance with features of embodiments described herein. In step 1300, the next frame is identified. In step 1302, candidate bins of the frame are identified FIG. 8). In step 1304, candidate clusters are identified (FIG. 9). In step 1306, ref is updated (FIG. 13). In step 1308, a determination is made whether to stop profiling. If a negative determination is made in step 1308, execution returns to step 1300; otherwise execution proceeds to step 1310. In step 1310, ref is set to equal ref multiplied by a scaling factor. Execution then terminates in step 1312.

Referring again to FIG. 14, illustrated therein is a flowchart showing logic for updating a reference to break a cluster in connection with the plant profiling logic of FIG. 13. In step 1400, the process is initialized. In step 1402, the next candidate cluster in the current frame is identified as the current candidate cluster. In step 1404, the next bin in the current candidate cluster is identified as the current bin. In step 1406, a determination is made whether the current bin is part of a candidate cluster in a previous frame. If so, execution proceeds to step 1408, in which the value of consistent bins is incremented, and then proceeds to step 1410. If a negative determination is made in step 1406, execution proceeds directly to step 1410. In step 1410, a determination is made whether the current bin is the last bin in the current candidate cluster. If not, execution returns to step 1404; otherwise, execution proceeds to step 1412. In step 1412, a determination is made whether the value of consistent bins is greater than a value of maximum consistent bins. If so, execution proceeds to step 1414, in which ref is updated to break the cluster (as shown in FIG. 12), and then to step 1416. If a negative determination is made in step 1412, execution proceeds directly to step 1416. In step 1416, a determination is made whether the current candidate cluster is the last candidate cluster in the current frame. If so, execution proceeds to step 1418, in which the reference values are written to a reference buffer; otherwise, execution returns to step 1402.

Referring again to FIG. 15, illustrated therein is a flowchart showing modified plant profiling logic for execution in concert with the arc detection decision logic of FIG. 7. In step 1500, the unscaled reference is loaded into memory. In step 1502, a next frame is identified as the current frame. In step 1504, the unscaled reference is used to identify candidate bins in the current frame. In step 1506, candidate clusters in the current frame are identified. In step 1508, the candidate for the future value of ref is updated. In step 1510, a determination is made whether it is time to update the reference buffer as indicated by a user or administrator. If not, execution returns to step 1502; otherwise, execution proceeds to step 1512, in which the value of ref is updated as described above. In step 1514, a determination is made whether it is time to reset the reference buffer. If not, execution returns to step 1502; otherwise, execution proceeds to step 1516, in which the reference buffer containing the candidate for the future value of ref is set to 0, and then returns to step 1502.

Referring again to FIG. 16, illustrated therein is a procedure for breaking a cluster in connection with the plant profiling logic of FIG. 13. In step 1600, a new cluster(start, size) is identified as the current cluster. As previously noted, a cluster is a collection of bins; for example, a particular cluster may be from bin 10 to 18. In that example, the cluster start value is 10 and size is 8, so the cluster is identified as cluster(10,8). In step 1602, a determination is made whether the size of the current cluster is less than a minimum cluster size. If so, execution terminates in step 1603; otherwise, execution proceeds to step 1604, in which a variable sub_cluster is set equal to cluster(start, $size_{min}$). In particular, a collection of consecutive bins is only considered a candidate cluster if it exceeds a minimum size (e.g., 5). Assuming the minimum size is 5, then the example cluster (size 8) exceeds the minimum size and needs to be broken so that it is no longer a candidate cluster. The breaking of a cluster at a bin means to increase the value of the particular bin in the reference buffer so that the ref spectra in that bin is more than the magnitude spectra. To accomplish this, in step 1606, ($Value_{min}$, $Pos_{min}$) is set equal to min (sub_cluster). In step

1606, min is a function that returns the minimum value and corresponding bin number. In step 1608, ref(Pos$_{min}$) is set equal to Value$_{min}$. In step 1610, new_cluster is set equal to cluster (Pos$_{min}$+1, size−Pos$_{min}$−1).

It should be noted that all of the specifications, dimensions, and relationships outlined herein (e.g., the number of elements, operations, steps, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, exemplary embodiments have been described with reference to particular component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system may be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and may accommodate a large number of components, as well as more complicated/sophisticated arrangements and configurations. Accordingly, the examples provided should not limit the scope or inhibit the broad teachings of the electrical circuits as potentially applied to myriad other architectures.

It should also be noted that in this Specification, references to various features (e.g., elements, structures, modules, components, steps, operations, characteristics, etc.) included in "one embodiment", "exemplary embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It should also be noted that the functions related to circuit architectures illustrate only some of the possible circuit architecture functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms maybe provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the device and system described above may also be implemented with respect to the method or process described herein and specifics in the examples may be used anywhere in one or more embodiments.

The 'means for' in these instances (above) may include (but is not limited to) using any suitable component discussed herein, along with any suitable software, circuitry, hub, computer code, logic, algorithms, hardware, controller, interface, link, bus, communication pathway, etc.

Note that with the example provided above, as well as numerous other examples provided herein, interaction may be described in terms of two, three, or four network elements. However, this has been done for purposes of clarity and example only. In certain cases, it may be easier to describe one or more of the functionalities of a given set of flows by only referencing a limited number of network elements. It should be appreciated that topologies illustrated in and described with reference to the accompanying FIGURES (and their teachings) are readily scalable and may accommodate a large number of components, as well as more complicated/sophisticated arrangements and configurations. Accordingly, the examples provided should not limit the scope or inhibit the broad teachings of the illustrated topologies as potentially applied to myriad other architectures.

It is also important to note that the steps in the preceding flow diagrams illustrate only some of the possible signaling scenarios and patterns that may be executed by, or within, communication systems shown in the FIGURES. Some of these steps may be deleted or removed where appropriate, or these steps may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. Substantial flexibility is provided by communication systems shown in the FIGURES in that any suitable arrangements, chronologies, configurations, and timing mechanisms may be provided without departing from the teachings of the present disclosure.

Although the present disclosure has been described in detail with reference to particular arrangements and configurations, these example configurations and arrangements may be changed significantly without departing from the scope of the present disclosure. For example, although the present disclosure has been described with reference to particular communication exchanges, embodiments described herein may be applicable to other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 142 as it exists on the date of the filing hereof unless the words "means for" or "step for" are specifically used in the particular claims;

and (b) does not intend, by any statement in the specification, to limit this disclosure in any way that is not otherwise reflected in the appended claims.

What is claimed is:

1. An arc detection method for a power system, the method comprising:
sampling a signal on a power line to generate a series of digital samples at a first sampling frequency; and
classifying, by an arc detector, whether an arc fault is present in the power system, wherein the classifying further comprises:
for each of a plurality of bins comprising a current frame of the series of digital samples, marking the bin as a candidate bin if a magnitude spectrum of the bin falls within a first frequency range and exceeds a reference magnitude spectrum;
determining a number of candidate bins in the current frame, wherein the number of candidate bins in the frame comprises a cluster size;
marking the number of candidate bins as candidate cluster bins if the cluster size exceeds a minimum cluster size;
for each of the candidate cluster bins, determining whether the candidate cluster bin is also a candidate cluster bin of a previous frame of the series of digital samples and if so, identifying the current frame as a candidate frame and incrementing a candidate frame count; and
if the candidate frame count exceeds a candidate frame count threshold, determining that an arc fault is present in the power system.

2. The method of claim 1 further comprising profiling the power system to determine an initial level of the reference magnitude spectrum.

3. The method of claim 2, wherein the profiling the power system further comprises updating a value of the reference magnitude spectrum based on to eliminate false arc detection based on noise signals.

4. The method of claim 1 further comprising filtering the plurality of digital samples to remove a switching noise frequency from the series of digital samples.

5. The method of claim 1 further comprising transforming a portion of the series of digital samples to a frequency-domain representation.

6. The method of claim 1, wherein the first sampling frequency is selected to accurately represent a spectral component of the signal up to 100 KHz.

7. The method of claim 1, wherein the first sampling frequency is a frequency within a range of 500 KHz to 600 KHz.

8. The method of claim 1, wherein the first sampling frequency is an integral multiple of a switching noise frequency.

9. The method of claim 1, wherein the frequency range comprises 20 KHz to 100 KHz.

10. The method of claim 1, wherein a length of a comb filter for filtering the plurality of digital samples to remove a switching noise frequency from the series of digital samples is equal to the first sampling frequency divided by the switching noise frequency.

11. The apparatus of claim 1, wherein the first sampling frequency is an integral multiple of a switching noise frequency.

12. An apparatus with arc detection for a power system, the apparatus comprising:

an analog-to-digital converter ("ADC") for sampling a signal on a power line to generate a series of digital samples at a first sampling frequency;
an arc detector for classifying whether an arc fault is present in the power system, wherein the classifying further comprises:
for each of a plurality of bins comprising a current frame of the signal, marking the bin as a candidate bin if a magnitude spectrum of the bin falls within a first frequency range and exceeds a reference magnitude spectrum;
determining a number of candidate bins in the current frame, wherein the number of candidate bins in the frame comprises a cluster size;
marking the number of candidate bins as candidate cluster bins if the cluster size exceeds a minimum cluster size;
for each of the candidate cluster bins, determining whether the candidate cluster bin is also a candidate cluster bin of a previous frame of the series of digital samples and if so, identifying the current frame as a candidate frame and incrementing a candidate frame count; and
if the candidate frame count exceeds a candidate frame count threshold, determining that an arc fault is present in the power system.

13. The apparatus of claim 12 further comprising a comb filter for filtering the plurality of digital samples to remove a switching noise frequency from the series of digital samples.

14. The apparatus of claim 13 wherein a length of the comb filter is equal to the first sampling frequency divided by the switching noise frequency.

15. The apparatus of claim 12 further comprising a Fast Fourier Transform ("FFT") module for transforming a first window of the series of digital samples to a first frequency-domain representation.

16. The apparatus of claim 12, wherein the power system comprises a photovoltaic ("PV") power system.

17. A method for classifying whether an arc fault is present in a power system comprising:
for each of a plurality of bins comprising a current frame of a series of digital samples comprising a signal on a power line of the power system sampled at a first sampling frequency, marking the bin as a candidate bin if a magnitude spectrum of the bin falls within a first frequency range and exceeds a reference magnitude spectrum;
determining a number of candidate bins in the current frame, wherein the number of candidate bins in the frame comprises a cluster size;
marking the number of candidate bins as candidate cluster bins if the cluster size exceeds a minimum cluster size;
for each of the candidate cluster bins, determining whether the candidate cluster bin is also a candidate cluster bin of a previous frame of the series of digital samples and if so, identifying the current frame as a candidate frame and incrementing a candidate frame count; and
if the candidate frame count exceeds a candidate frame count threshold, determining that an arc fault is present in the power system.

18. The method of claim 17, wherein the frequency range comprises 20 KHz to 100 KHz.

19. The method of claim 17 further comprising:
profiling the power system to determine an initial level of the reference magnitude spectrum; and updating a value of the reference magnitude spectrum based on to eliminate false arc detection based on noise signals.

20. The method of claim 17, wherein the power system comprises a photovoltaic ("PV") power system.

* * * * *